United States Patent
Lytle et al.

(10) Patent No.: US 8,829,661 B2
(45) Date of Patent: Sep. 9, 2014

(54) WARP COMPENSATED PACKAGE AND METHOD

(75) Inventors: William H. Lytle, Chandler, AZ (US);
Scott M. Hayes, Chandler, AZ (US);
George R. Leal, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 2340 days.

(21) Appl. No.: 11/372,666

(22) Filed: Mar. 10, 2006

(65) Prior Publication Data

US 2007/0210427 A1 Sep. 13, 2007

(51) Int. Cl.
*H01L 23/02* (2006.01)
*H01L 23/00* (2006.01)
(Continued)

(52) U.S. Cl.
CPC ... *H01L 23/5389* (2013.01); *H01L 2924/19041* (2013.01); *H01L 2924/19043* (2013.01); *H01L 2223/5442* (2013.01); *H01L 2924/014* (2013.01); *H01L 24/82* (2013.01); *H01L 2924/01047* (2013.01); *H01L 2924/01082* (2013.01); *H01L 2924/01023* (2013.01); *H01L 2924/12044* (2013.01); *H01L 2924/01006* (2013.01); *H01L 2924/01033* (2013.01); *H01L 2924/01029* (2013.01); *H01L 2924/01078* (2013.01); *H01L 2924/09701* (2013.01); *H01L 2224/24137* (2013.01); *H01L 21/6835* (2013.01); *H01L 2924/01013* (2013.01); *H01L 2223/5446* (2013.01); *H01L 24/24* (2013.01); *H01L 21/568* (2013.01); *H01L 2924/0102* (2013.01); *H01L 2924/19042* (2013.01); *H01L 2924/3511* (2013.01); *H01L 23/544* (2013.01); *H01L 2924/14* (2013.01); *H01L 21/561* (2013.01); *H01L 24/96* (2013.01)
USPC ............. 257/678; 257/E23.178; 257/E23.179

(58) Field of Classification Search
USPC ......... 438/106–112, 131–127, 25–26, 51, 55, 438/64, 121–127
See application file for complete search history.

(56) References Cited

U.S. PATENT DOCUMENTS 4,722,914 A 2/1988 Drye et al.
(Continued)

FOREIGN PATENT DOCUMENTS

EP 0611129 B1 8/1994
WO 03065778 A1 8/2003

OTHER PUBLICATIONS

International Search Report and Written Opinion.

*Primary Examiner* — David Vu
*Assistant Examiner* — Jonathan Han
(74) *Attorney, Agent, or Firm* — Sherry W. Schumm (57) ABSTRACT

Methods and apparatus are provided for an electronic panel assembly (EPA) (82, 83), comprising: providing one or more electronic devices (30) with primary faces (31) having electrical contacts (36), opposed rear faces (33) and edges (32) therebetween. The devices (30) are mounted primary faces (31) down on a temporary support (60) in openings (44) in a warp control sheet (WCS) (40) attached to the support (60). Plastic encapsulation (50) is formed at least between lateral edges (32, 43) of the devices (30) and WCS openings (44). Undesirable panel warping (76) during encapsulation is mitigated by choosing the WCS coefficient of thermal expansion (CTE) to be less than the encapsulation CTE. After encapsulation cure, the EPA (82) containing the devices (30) and the WCS (40) is separated from the temporary support (60) and, optionally, mounted on another carrier (70) with electrical contacts (36) exposed. Thin film insulators (85) and conductors (87) are desirably applied to couple electrical contacts (36) on various devices (30) to each other and to external terminals (88), thereby forming an integrated multi-device EPA (84).

18 Claims, 6 Drawing Sheets

(51) Int. Cl.
  *H01L 21/683* (2006.01)
  *H01L 21/56* (2006.01)
  *H01L 23/538* (2006.01)
  *H01L 23/544* (2006.01)

(56) References Cited

U.S. PATENT DOCUMENTS

| | | | |
|---|---|---|---|
| 4,783,695 A | 11/1988 | Eichelberger et al. | |
| 5,005,069 A | 4/1991 | Wasmer et al. | |
| 5,134,463 A | 7/1992 | Yamaguchi | |
| 5,353,498 A | 10/1994 | Fillion et al. | |
| 6,224,936 B1 | 5/2001 | Gochnour et al. | |
| 6,441,474 B2 | 8/2002 | Naitoh et al. | |
| 6,470,946 B2 | 10/2002 | De | |
| 6,492,723 B2 | 12/2002 | Suyama | |
| 6,548,330 B1 | 4/2003 | Murayama et al. | |
| 6,555,906 B2 | 4/2003 | Towle et al. | |
| 6,696,764 B2 * | 2/2004 | Honda | 257/778 |
| 6,706,553 B2 | 3/2004 | Towle et al. | |
| 6,707,137 B2 | 3/2004 | Kim | |
| 6,713,366 B2 | 3/2004 | Mong et al. | |
| 6,717,248 B2 * | 4/2004 | Shin et al. | 257/678 |
| 6,825,063 B2 | 11/2004 | Vu et al. | |
| 6,835,897 B2 | 12/2004 | Chang et al. | |
| 6,838,776 B2 | 1/2005 | Leal et al. | |
| 6,867,484 B2 | 3/2005 | Nakajima et al. | |
| 6,869,894 B2 | 3/2005 | Moore | |
| 6,921,975 B2 | 7/2005 | Leal et al. | |
| 2001/0001740 A1 * | 5/2001 | Miyawaki | 438/700 |
| 2003/0094682 A1 * | 5/2003 | Shinohara et al. | 257/685 |
| 2003/0147227 A1 | 8/2003 | Egitto et al. | |
| 2004/0104491 A1 * | 6/2004 | Connell et al. | 257/787 |
| 2004/0238942 A1 | 12/2004 | Chakravorty et al. | |
| 2004/0256720 A1 | 12/2004 | Yap et al. | |
| 2004/0256731 A1 | 12/2004 | Mao et al. | |
| 2005/0040513 A1 | 2/2005 | Salmon | |
| 2005/0057908 A1 * | 3/2005 | Egitto et al. | 361/795 |
| 2005/0085008 A1 * | 4/2005 | Derderian et al. | 438/106 |
| 2005/0095812 A1 | 5/2005 | Derderian et al. | |
| 2005/0116337 A1 | 6/2005 | Chua et al. | |
| 2005/0140007 A1 | 6/2005 | Jobetto | |
| 2005/0158009 A1 * | 7/2005 | Eichelberger et al. | 385/147 |

* cited by examiner

WARP COMPENSATED PACKAGE AND METHOD

TECHNICAL FIELD

The present invention generally relates to electronic devices, and more particularly relates to packaging of semiconductor and other types of chip devices in planar panel configuration.

BACKGROUND

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistors and inductors, and combinations and arrays of any and all of these types of devices and elements. Further, the present invention does not depend upon the types of die or chips being used nor the materials of which they are constructed provided that such materials withstand the encapsulation process.

In certain types of electronic device packaging where connections to multiple devices included in the package are made after encapsulation, there is a problem referred to as warping that can occur during encapsulation. Warping is of particular concern in electronic assemblies that are in the form of a comparatively flat or planar panel whose device electrical connections are exposed on a principal surface. It is often desired to form an integrated electronic assembly by interconnecting the various devices in the panel using planar processing technology. If the panel has warped during encapsulation, the process of adding the interconnects becomes difficult, which can affect overall yield and cost. Thus, control or elimination of warping is important to achieving high manufacturing yields and low manufacturing costs in such encapsulated planar assemblies.

Accordingly, it is desirable to provide packaging for electronic devices that avoids or mitigates the adverse effects of warping during encapsulation. It is further desirable that the packaging is suitable for use with arrays containing multiple devices and/or multiple types of devices and especially device arrays where it is desired that the primary faces of the devices are available for electrical connections thereto by planar processing or the like after the devices are fixed in the encapsulation. In addition, it is desirable that the methods, materials and structures employed be compatible with available manufacturing capabilities and materials and not require substantial modifications of manufacturing procedures or substantially increase manufacturing costs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner. The term "bonding pad" singular or plural is intended to refer to any type of electrical connection place on a device and is not limited merely to those suitable for electrical connection by welding or soldering on a wire or other lead.

Figure 1:
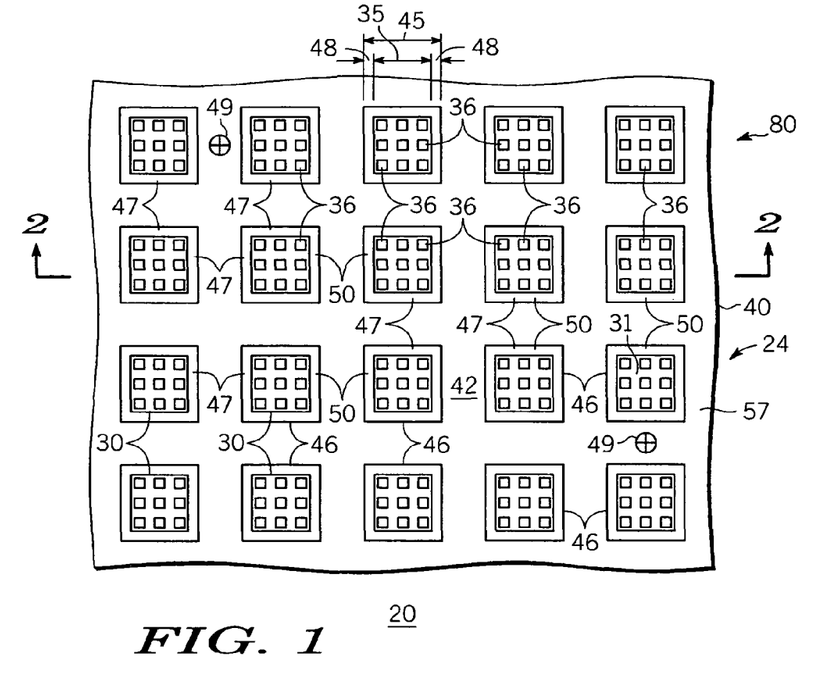
FIG. 1 is a plan view of an array of multiple electronic devices partially encapsulated to form an electronic panel assembly (EPA) wherein electrical connection locations on the multiple devices are exposed on a principal surface of the panel assembly, according to an embodiment of the present invention.
Figure 2:
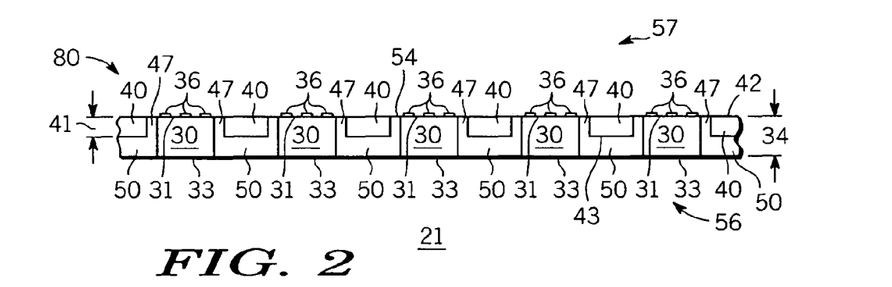
FIG. 2 is a simplified schematic cross-sectional view through the electronic panel assembly (EPA) of FIG. 1 under ideal conditions without warping.
Figure 3:
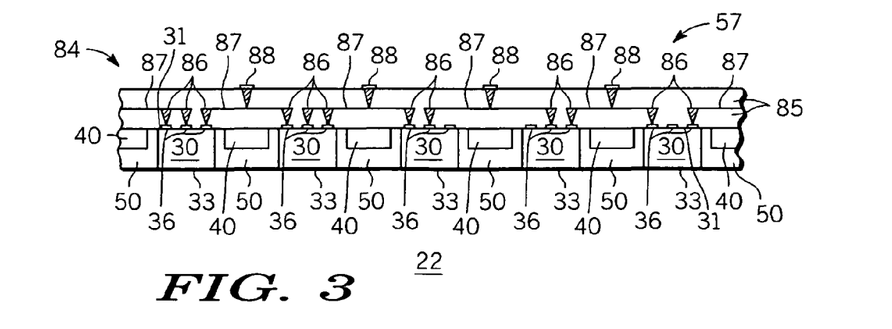
FIG. 3 is a simplified schematic cross-sectional view analogous to FIG. 2 through the electronic panel assembly of FIG. 1 after further processing to interconnect various devices of the panel to form an integrated electronic panel assembly (IEPA)

FIG. 1 shows plan view 20 of a portion of array 24 of multiple electronic devices 30 partially encapsulated to form electronic panel assembly (EPA) 80 wherein electrical connection locations 36 (hereafter bonding pads 36) on primary faces 31 of multiple devices 30 are exposed on a principal surface 57 of EPA 80, according to an embodiment of the present invention wherein perforated warp compensation sheet (WCS) 40 laterally surrounds individual devices 30 in encapsulation 50. FIG. 2 is a simplified cross-sectional view through EPA 80 of FIG. 1 showing further details under ideal conditions without warping. WCS 40 has openings or windows 44 therein in which devices 30 are located. Windows 44 have widths 45 that are larger than widths 35 of devices 30 so that frame-shaped gaps 47 of width 48 exist between lateral edges 32 of devices 30 and lateral edges 46 of windows 44 in WCS 40. Gaps 47 between edges 46 of windows 44 and edges 32 of devices 30 are filled with plastic encapsulation 50. Encapsulation 50 may also extend over rear faces 33 of devices 30 and/or rear face 43 of WCS 40. In the embodiments of FIGS. 2-3, devices 30 are illustrated as being thicker than WCS 40 so that encapsulation 50 covers rear face 43 of WCS 40 but not rear faces 33 of devices 30, but this merely by way of example and not intended to be limiting. Devices 30 are typically about 0.3 to 0.85 mm thick but thicker or thinner devices can also be used. Thickness 41 of WCS 40 can be thicker or thinner than thickness 34 of devices 30, with thickness 41 being about 25 to 200 percent of the thickness 34 being convenient in various embodiments. In the embodiments illustrated herein, thickness 41 of WCS 40 is shown as being about half of thickness 34 of devices 30 but this is merely for convenience of illustration and not intended to be limiting. While devices 30 are illustrated herein as being rectangular and of the same size, this is merely for convenience of description and not intended to be limiting. Devices 30 may have any size and shape as desired by the panel designer, with corresponding sizes and shapes for openings 44 in which devices 30 are to be located exceeding that of devices 30 by frame-shaped gap 47.

FIG. 3 is a simplified schematic cross-sectional view similar to that of FIG. 2 through EPA 80 of FIGS. 1-2, after further processing to interconnect various devices 30 of EPA 80 into integrated electronic panel assembly (IEPA) 84. Devices 30 have electrical connection locations 36 referred to for convenience and inclusively as "bonding pads," understanding that in various embodiments any type of electrical connection can be made thereto. One or more insulating layers 85, vias 86 through insulating layers 85 and conductor layers or interconnections 87 are provided over upper surface 57 of EPA 80 to interconnect various bonding pads 36 on the same or different devices 30 to each other or to external terminals 88 or to both. FIG. 3 is intended merely to illustrate the general principal by which various devices 30 are coupled together and/or to external terminals 88 and not to show a particular circuit arrangement. Persons of skill in the art will understand how to select such interconnections depending upon the particular devices in EPA 80 and the electrical function to be provided by IEPA 84. Insulators 85, vias 86 and interconnections 87 are preferably provided using conventional planar processing technology although in further embodiments other techniques such as screen printing, selective plating or deposition and other methods can also be used.

Figure 4:
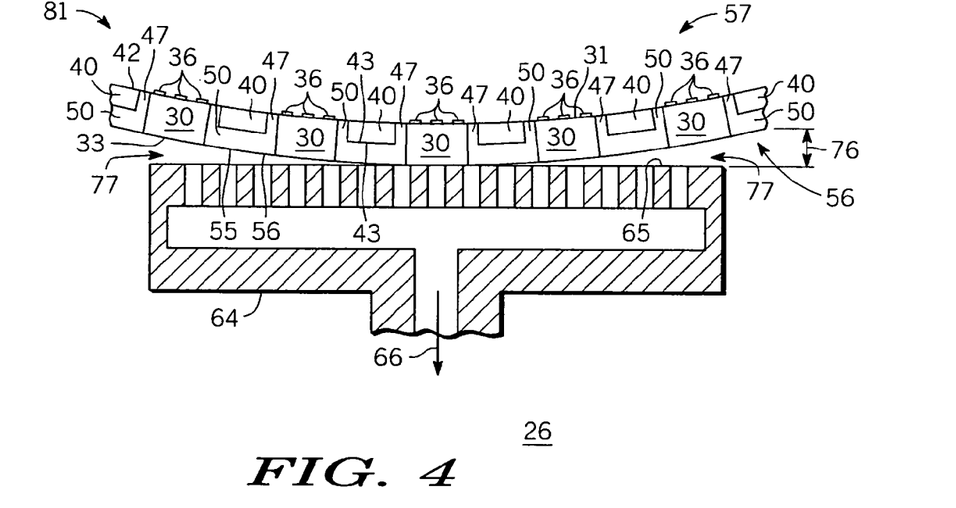
FIG. 4 is a simplified schematic cross-sectional view through the electronic panel assembly (EPA) of FIG. 1 located on a chuck for further processing, and illustrating how concave warping of the panel during encapsulation interferes with sealing the electronic panel assembly (EPA) against the chuck for such further processing.

FIG. 4 shows simplified schematic cross-sectional view 26 through warped electronic panel assembly (EPA) 81 located on spinner or alignment chuck 64 for further processing to provide insulating layers 85, vias 86 and interconnects 87. EPA 81 of FIG. 4 is analogous to EPA 80 of FIGS. 1-2 but with concave warping that can occur during encapsulation. As used herein, the term "concave" refers to the direction of curvature illustrated in FIG. 4 wherein the peripheral portion of panel 81 protrudes toward a viewer facing toward upper surface 57 containing bonding pads 36 and the central portion of the panel is depressed relative to the viewer. FIG. 4 illustrates how warping of EPA 81 during encapsulation can interfere with sealing lower or rear surface 56 of EPA 81 against upper surface 65 of chuck 64 for the further processing needed to form IEPA 84. EPA 81 is said to have "concave" warp by amount 76. "Concave" is defined looking toward upper panel surface 57 where bonding pads 36 are located. When vacuum 66 is pulled on chuck 64, air leaks in around open periphery 77 of EPA 81 because of concave warp amount 76 and EPA 81 does not seal against chuck 64. Even if a chuck with a curved upper surface was provided to obtain a seal against EPA 81, the lack of flatness of upper surface 57 of EPA 81 makes it difficult to use conventional planar processing technology to form vias 86 and define interconnects 87. Thus, such concave warped panels are difficult to process so as to form the desired integrated electronic assembly.

Figure 5:
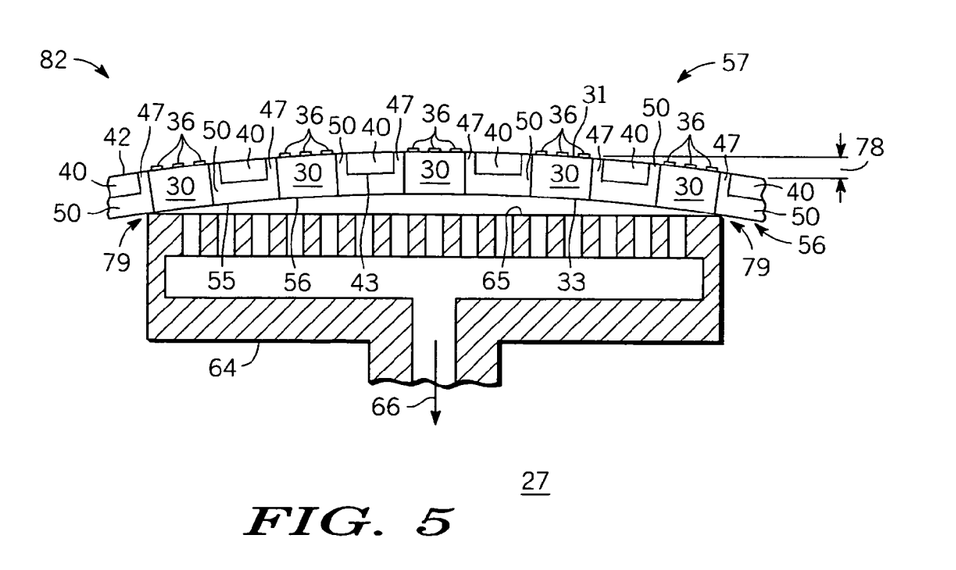
FIG. 5 is a simplified schematic cross-sectional view analogous to FIG. 4 through the panel assembly of FIG. 1 located on a chuck for further processing but illustrating how convex warping according to an embodiment of the present invention facilitates sealing the EPA against the chuck for such further processing.
Figure 6:
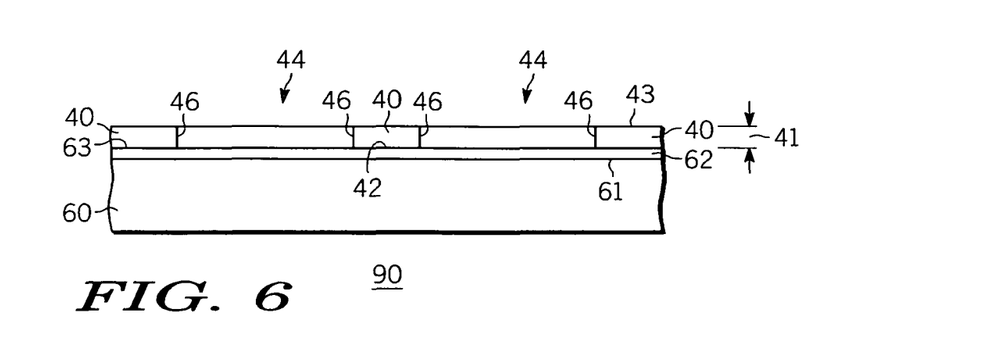
FIGS. 6-12 are simplified schematic cross-sectional views analogous to those of FIGS. 2-3 of electronic device plastic encapsulation with a warp compensation sheet at different stages of manufacture of a multi-device EPA and IEPA, according to a still further embodiment of the present invention.

FIG. 5 is a simplified schematic cross-sectional view 27 analogous to FIG. 4 but through electronic panel assembly (EPA) 82 located on upper surface 65 spinner or alignment chuck 64 for further processing. EPA 82 is analogous to EPA 80 of FIGS. 1-2, but with convex warp looking toward panel surface 57, according to an embodiment of the present invention. As used herein, the term "convex" refers to the direction of curvature illustrated in FIG. 5 wherein the central portion of panel 82 protrudes toward a viewer facing toward upper surface 57 containing bonding pads 36 and the peripheral portion of the panel is depressed relative to the viewer. FIG. 5 illustrates how reversing the direction of warping according to an embodiment of the present invention facilitates sealing EPA 82 against upper surface 65 of chuck 64 at periphery 79. Applying vacuum 66 to chuck 64 will generally pull EPA 82 flat against upper surface 65 of chuck 64 so that planar processing technology may be used to provide insulating layers 85, vias 86 and interconnections 87, as is desired to form IEPA 84 of FIG. 3.

FIGS. 6-13 are simplified schematic cross-sectional views analogous to those of FIGS. 2-3 of EPA 82, 83 and integrated electronic panel assembly (IEPA) 84 including warp control sheet (WPS) 40 at different stages 90 through 96 of manufacture according to further embodiments of the present invention. Like reference numbers are used for like regions. Referring now to manufacturing stage 90 of FIG. 6, temporary substrate 60 having upper surface 61 is provided. Substrate 60 is conveniently of porous ceramic, for example and not intended to be limiting, alumina with approximately 0.5 micro-meter continuous porosity manufactured by Refractron Technologies of New York, USA, but other comparatively inert materials may also be used. It is preferably porous to assist in later separating it from the EPA 82. In stage 90 of FIG. 6, WCS 40 of thickness 41 is mounted on surface 61 of temporary substrate 60 using thin temporary adhesive layer 62 having upper surface 63 in contact with surface 42 of WCS 40. In a preferred embodiment, double sided polyimide sticky-tape with silicone adhesive on both sides manufactured by Permacel of New Jersey is used, but in further embodiments other types of non-permanent adhesive materials may also be used. What is important is that adhesive layer 62 withstands subsequent processing without becoming brittle or permanently fixed in place, since at a later stage of manufacture, WCS 40 with embedded devices 30 will be separated from adhesive layer 62. Perforations or openings 44 in WCS 40 have lateral edges 46.

If copper or other comparatively high coefficient of thermal expansion (CTE) material is used for WCS 40, then generally concave warping such as is illustrated in FIG. 4 is obtained. It has been found that by employing lower CTE materials for WCS 40, such as for example and not intended to be limiting Alloy 42 or Alloy 49, that the direction of warping is reversed so as to obtain convex warping, which much more readily permits sealing EPA 82 to spinner or alignment chuck 64 and other post encapsulation processing equipment. While WCS 40 is preferably of such metals, non conductive materials with appropriate CTE can also be used. The optimum choice of WCS 40 will depend upon the CTE of devices 30 and encapsulation 50. Silicon, which is commonly used in devices 30 has a CTE of about 2.7-3.5 parts-per-million per degree centigrade (ppm/° C.). Plastic encapsulation 50 as described herein has a CTE of about 13 ppm/° C. Substrates and carriers 60, 70 used in the fabrication of the electronic panel assemblies described herein (see FIGS. 9 and 11) can have CTE's in the range of about 6.0-7.7 ppm/° C. for alumina and about 3.25 ppm/° C. for Pyrex® glass. Various materials available in sheet form and their CTE's in the temperature range of about 30-200° C. encountered during encapsulation are copper 17.2 ppm/° C., aluminum 23.2 ppm/° C., laminated fiberboard 15.0 ppm/° C., and various NiFe alloys such as Alloy 52 with 10.4 ppm/° C., Alloy 29 with about 10 ppm/° C., Alloy 48 with 9.4 ppm/° C., Alloy 46 with 7.9 ppm/° C., Alloy 42 with 4.5 ppm/° C., Invar 36 with 1.72 ppm/° C., and so forth. Such materials are well known in the art and are available from many manufacturers such as for example and not intended to be limiting, National Electronic Alloys, Inc. of Santa Ana, Calif. It is desirable that WCS 40 be substantially planar.

Table I below shows the EPA warp amount and direction for different WCS materials, for EPA 80, 82 of about 200 mm diameter and about 0.650 mm thickness and the encapsulant material described herein. For this combination, copper was not desirable as a WCS material because it produced concave warp, so that the resulting panels were difficult or impossible to seal against a standard post-processing chuck, such as chuck 64 of FIG. 4. While Alloy 42 provided the desired convex warp, the magnitude of the warp (5-6.5%) was large enough to make it difficult to seal the panels, for example against an alignment chuck for further processing. Thus, it is desirable that WCS 40 be made of a material to provide in combination with the material of encapsulation 50, a post-encapsulation convex warp less than about 5% of the lateral dimensions of the panel. Alloy 49 provided better results with convex warp of only about 1-1.5% of the panel diameter or lateral dimensions, so that vacuum 66 (see FIG. 5) could easily pull the panels flat on the alignment or other tool chuck for further planar processing. Thus it will be apparent that by choosing WCS 40 of a material with an appropriate range of CTE compared to encapsulation 50, that panels 80, 82 can be provided that are convex and sufficiently flat to readily permit subsequent processing to provide integrated electronic panel assemblies 84 using conventional planar processing. The optimum choice of CTE for WCS 40 will vary depending upon the choice of encapsulant material and the relative thickness of devices 30, WCS panel 40 and encapsulation 50 but can be determined without undue experimentation depending upon the choices made by the panel designer. However, it is generally desirable that WCS 40 have a CTE that is less than that of encapsulation 50, usefully about 50-95% of the CTE of encapsulation 50, more conveniently about 55-85% of the CTE of encapsulation 50, and preferably about 60-80% of the CTE of encapsulation 50. Stated another way, it is desirable that WCS 40 have a CTE usefully about in the range 6.5-12.4 ppm/° C., more conveniently about 7.2-11.1 ppm/° C. and preferably about 7.8-10.4 ppm/° C. Stated still another way, it is desirable that the material of WCS 40 and encapsulation 50 be chosen so that the resulting warp of resulting EPA 82 is convex and less than ~5% and preferably in the range of about 1-2% or less of the lateral extent of EPA 82.

TABLE I

EPA WARP AMOUNT AND DIRECTION FOR DIFFERENT WCS MATERIALS

| # | WCS Material | CTE per ° C. | Deflection Amount | Deflection Direction |
|---|---|---|---|---|
| 1 | Copper | ~17 ppm | 1-2 mm | Concave |
| 2 | Alloy 42 | ~5 ppm | 10-13 mm | Convex |
| 3 | Alloy 49 | ~10 ppm | 2-3 mm | Convex |

Figure 7:
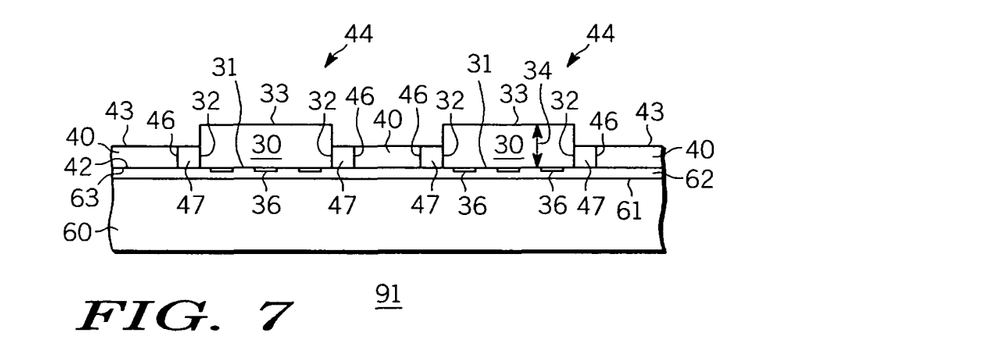

In stage 91 of FIG. 7, devices 30 are mounted in openings 44 in WCS 40 by placing devices 30 with their primary faces 31 on adhesive layer 62, that is, with bonding pads 36 facing adhesive layer 62. Edges 32 of devices 30 face edges 46 of WCS 40 in openings 44, so that there is annular space or gap 47 of mean width 48 surrounding each device 32 separating it from WCS 40. In various embodiments, width 48 of annular space or gap 47 is usefully in the range of about 25 to 700 micrometers, more preferably about 100 to 500 micrometers and preferably about 200 to 300 micrometers. Stated another way, width 48 of spacer or gap 47 is usefully about 25 to 200 percent of thickness 41 of WCS 40, more conveniently about 50 to 150 percent of thickness 41 and preferably about 75 to 125 percent of thickness 41. Stages 90 and 91 can be carried out in either order, but it is preferably to perform stage 90 first. In stage 92 of FIG. 8, resin encapsulation 50 is applied in at least annular gaps 47 between devices 30 and WCS 40 and, optionally in further embodiments over rear faces 33 of devices 30 and/or rear faces 43 of WCS 40. Type R1007RC-H silica filled epoxy manufactured by the Nagase company of Tokyo, Japan is a suitable material for encapsulation 50, but other well known encapsulants can also be used, including variations of type R1007RC-H. The structure of FIG. 8 results wherein devices 30 are now held in place relative to WCS 40 by encapsulation 50. Encapsulation 50 is desirably cured using a thermal treatment recommended by the manufacturer for the chosen resin. For the above noted resin, a one or two step cure at temperatures in the range of about 50-170° C. or 30-120 minutes is useful with about 100-150° C. for about 60-90 minutes being preferred.

Figure 8:
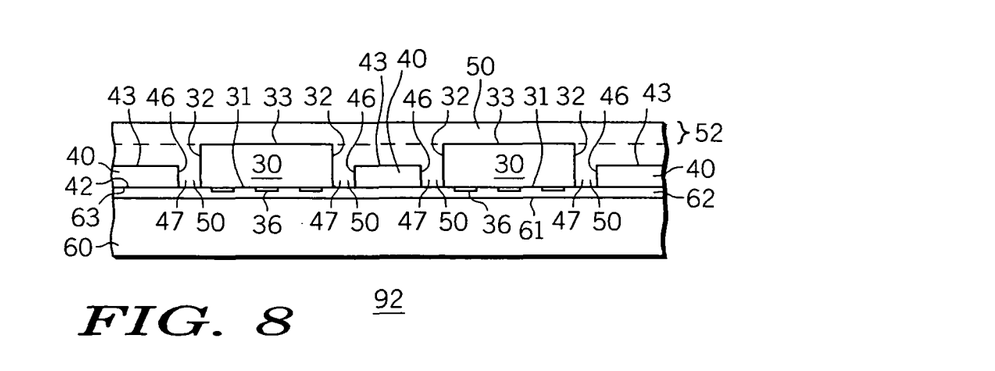
Figure 9:
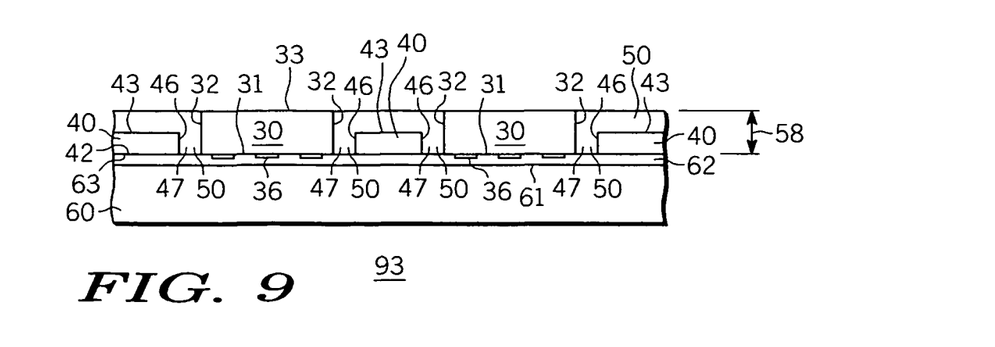

In a further embodiment in optional manufacturing stage 93 of FIG. 9, portion 52 (see FIG. 8) of encapsulation 50 lying above rear faces 33 of devices 30 and rear face 43 of WCS 40 may be removed (e.g., by grinding or chemical etching or other convenient techniques) to expose rear faces 33 of devices 30. This is referred to conveniently as "backgrind" or "backgrinding" even though in various embodiments other techniques besides grinding may be used to remove portion 52 of encapsulation 50, and such other techniques are intended to be included in the terms "backgrind" and "backgrinding." Backgrinding facilitates bringing a heat sink in direct contact with rear faces 33 of devices 30, but is not essential. After backgrinding stage 93, rear face 43 of WCS 40 may or may not be exposed from encapsulation 50 depending upon the relative thickness of WCS 40 compared to devices 30 and the amount of backgrinding performed.

Figure 10:
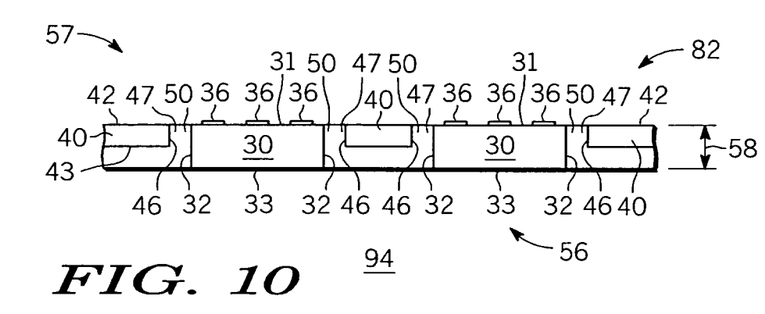

In manufacturing stage 94 of FIG. 10, temporary support substrate 60 and adhesive layer 62 are removed, thereby exposing primary faces 31 and bonding pads 36 of devices 30, and forming free-standing multi-device electronic panel assembly (EPA) 82 wherein devices 30 are held in place at least by their edges 32 embedded in encapsulation 50. Where adhesive 62 is a silicone adhesive, soaking the structure of FIG. 9 in acetone facilitates separation of devices 30, WCS 40, and remaining encapsulation 50 as a unit from temporary support 60, to provide multi-device electronic panel assembly (EPA) 82 of FIG. 10. In FIG. 10, EPA 82 has been flipped over compared to its orientation in FIGS. 6-9 so that bonding pads 36 and surfaces 31 now face upward. Bonding pads 36 on various devices 30 are now exposed and available for interconnection in any manner desired by the panel designer or user. In this way, extraordinarily complex functions may be provided by EPA 82, since multiple devices 30 of different types and functions may be combined and interconnected in a single panel. This is a great convenience where it is desired to use different chips or die made from different materials by different processes to optimize overall performance. As is explained more fully in connection with FIG. 15 and illustrated in FIG. 3, EPA 82 of FIG. 10 may have insulating layers 85, vias 86 and interconnections 87 applied directly on EPA 82 to provide IEPA 84, or EPA 82 may proceed to optional manufacturing stage 95 of FIG. 11.

Figure 11:
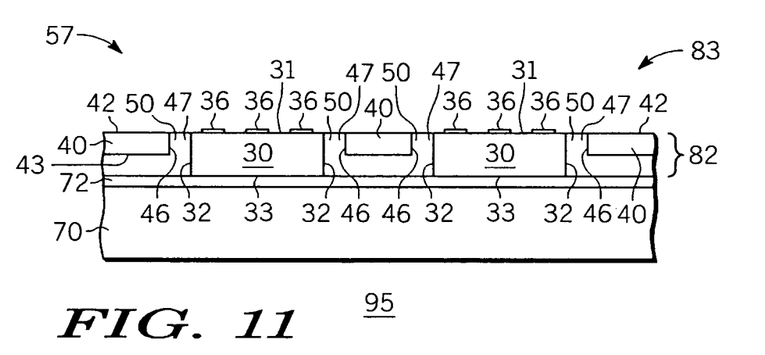

In a further embodiment illustrated by manufacturing stage 95 of FIG. 11, EPA 82 is optionally but not essentially mounted on upper surface 71 of support carrier 70 by adhesive layer 72 to form composite panel or EPA 83. Adhesive layer 72 is preferably of the same type as adhesive layer 62, but a wide variety of attachment materials may be used in various embodiments. Support carrier 70 may be ceramic, glass, metal, semiconductor, sapphire, fiberglass, various plastics and combinations thereof or other materials well known in the electronic arts. Use of support carrier 70 is convenient for subsequent processing of EPA 82, 83 but is not essential. A second cure cycle may be performed if that provided after encapsulation stage 92 has not provided sufficient curing of encapsulation 50. EPA 82, 83 is useful in its present form or, according to other embodiments, further processing may be provided to interconnect the various devices in EPA 82, 83.

Figure 12:
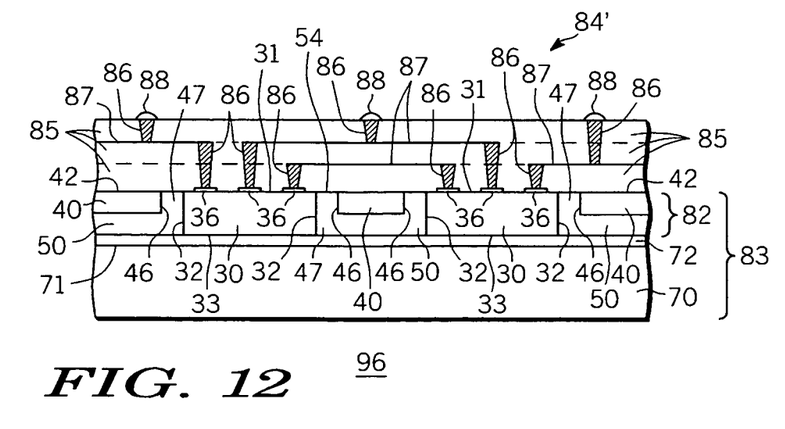

In optional manufacturing stage 96 of FIG. 12 according to further embodiments, one or more insulating layers 85 are provided over surface 31 of devices 30, surface 54 of encapsulation 50 and outer surface 42 of WCS 40, collectively upper surface 57 of EPA 82, 83. Layers 85, vias 86, interconnects 87 and external terminal 88 are preferably provided using conventional planar processing technology, but other methods for forming these structures may also be used. Organic polymers in liquid or dry films are suitable for insulating layers 85, but in various further embodiments a wide range of other materials well known in the electronic art for interlayer dielectrics may also be used. Layers 85 are patterned and etched to form vias 86 and expose bonding pads 36 on devices 30, and one or more conductors 87 are applied to interconnect various bonding pads 36 on devices 30 to each other or to external terminals 88 or to both, to provide integrated electronic panel assembly (IEPA) 84 comprising whatever circuit or system configuration is desired by the designer of EPA 82, 83. Conductors 87 may be metal, metal alloy, doped semiconductor, semi-metals, and/or combinations thereof. Such materials and techniques for applying them are well known in the art. While only three bonding pads are shown on each device 30 in FIG. 12 as being connected and/or only to an adjacent device and external terminals 88, this is merely for convenience of illustration of the general principal and not intended to be limiting. Persons of skill in the art will understand based on the teachings herein that bonding pads 36 and devices 30 are representative of multiple bonding pads present on multiple devices of the same or different types, and that any number of bonding pads 36 on any of devices 30 may be interconnected in any desired combination to any bonding pads 36 on the same or any other devices 30 or other active or passive device in panel 82, 83 so as to form IEPA 84 with WCS 40 therein as generally illustrated in FIG. 12. Various fiduciary marks 49, 69 (see FIGS. 1 and 13) may be provided on WCS 40 to facilitate placement of devices 30 in openings 44 of WCS 40 and for alignment of various masks or printing layers for forming insulating layers 85, vias 86 needed to expose bonding pads 36, conductors 87 and external connections 88.

Figure 13:
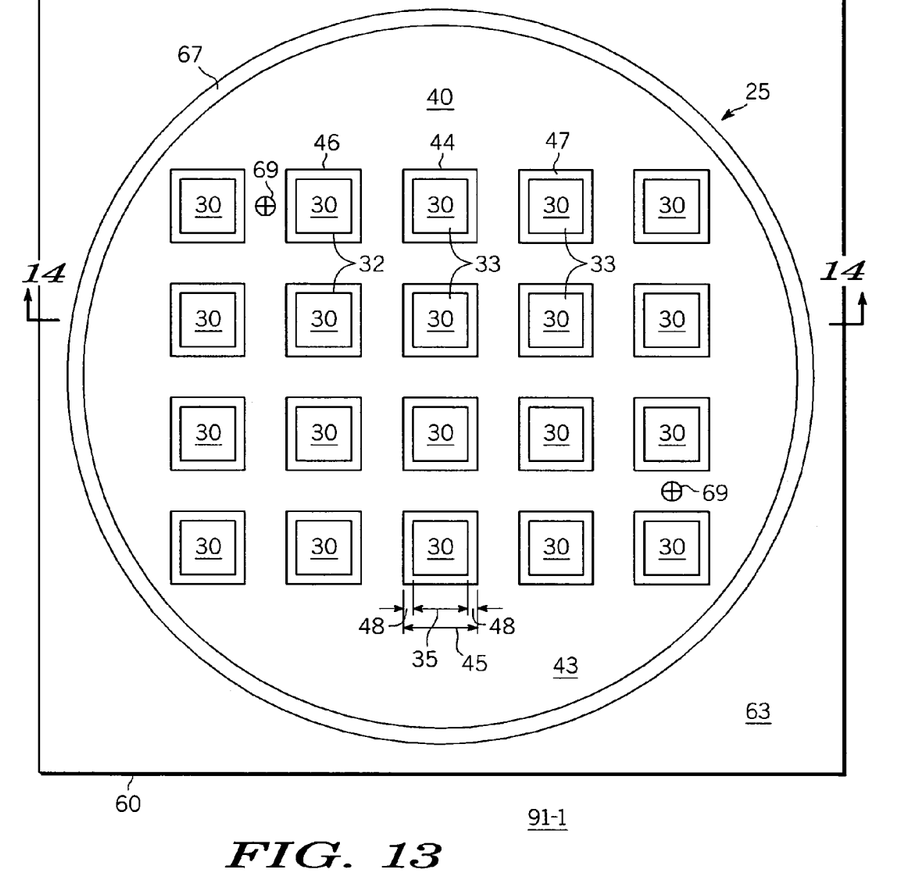
FIG. 13 is a plan view of the of an array of electronic devices with the warp compensation sheet of FIG. 6, viewed toward the rear faces of the devices and sheet and surrounded by a mold frame according to a further embodiment of the present invention, just prior to encapsulation and showing further details.
Figure 14:
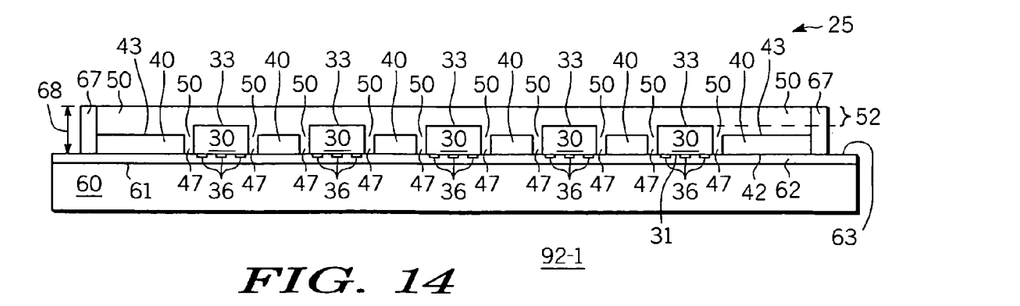
FIG. 14 is a simplified schematic cross-section through the array of FIG. 14 just after encapsulation with the mold frame still in place.

FIG. 13 shows a plan view according to a still further embodiment of manufacturing stage 91-1 of array 25 of electronic devices 30 and WCS 40 corresponding to stage 91 of FIG. 7 just prior to encapsulation, viewed toward their rear faces 33, 43 and showing further details. Devices 30 are located in openings 44 in WCS 40, mounted on adhesive layer 62 over temporary substrate 60. Array 25 of devices 30 and WCS 40 are desirably laterally surrounded by mold frame 67 also mounted on adhesive 62. Mold frame 67 is preferably of metal, as for example, and not intended to be limiting, cold rolled or spring steel but other materials may also be used. While mold frame 67 is shown in FIG. 13 as having an open (i.e., no top) circular shape in plan view this is merely for convenience of description and not intended to be limiting. Mold frame 67 may have any convenient plan shape and may be open or partially open. Mold frame 67 conveniently serves to limit the lateral extent of encapsulation 50 about to be placed in gaps 47 between edges 32 of devices 30 and edges 46 of openings 44 in WCS 40. In this embodiment, encapsulation 50 conveniently but not essentially extends over rear faces 33 of devices 30 and rear face 43 of WCS 40, as can be seen in FIG. 14. FIG. 14 denoted as manufacturing stage 92-1 is a simplified schematic cross-sectional view through array 25 of FIG. 13 along line 14 indicated in FIG. 13 and corresponds to stage 92 of FIG. 8, just after encapsulation 50 has been provided. It will be noted in stage 92-1 of FIG. 14, that mold frame 67 acts as a temporary dam that laterally contains encapsulation 50. In this embodiment, height 68 of mold frame 67 can be conveniently used to set the thickness of portion 52 of encapsulation 50 over rear faces 33 of devices 30 and rear face 43 of WCS 40. Use of mold frame 67 is preferred but not essential.

Figure 15:
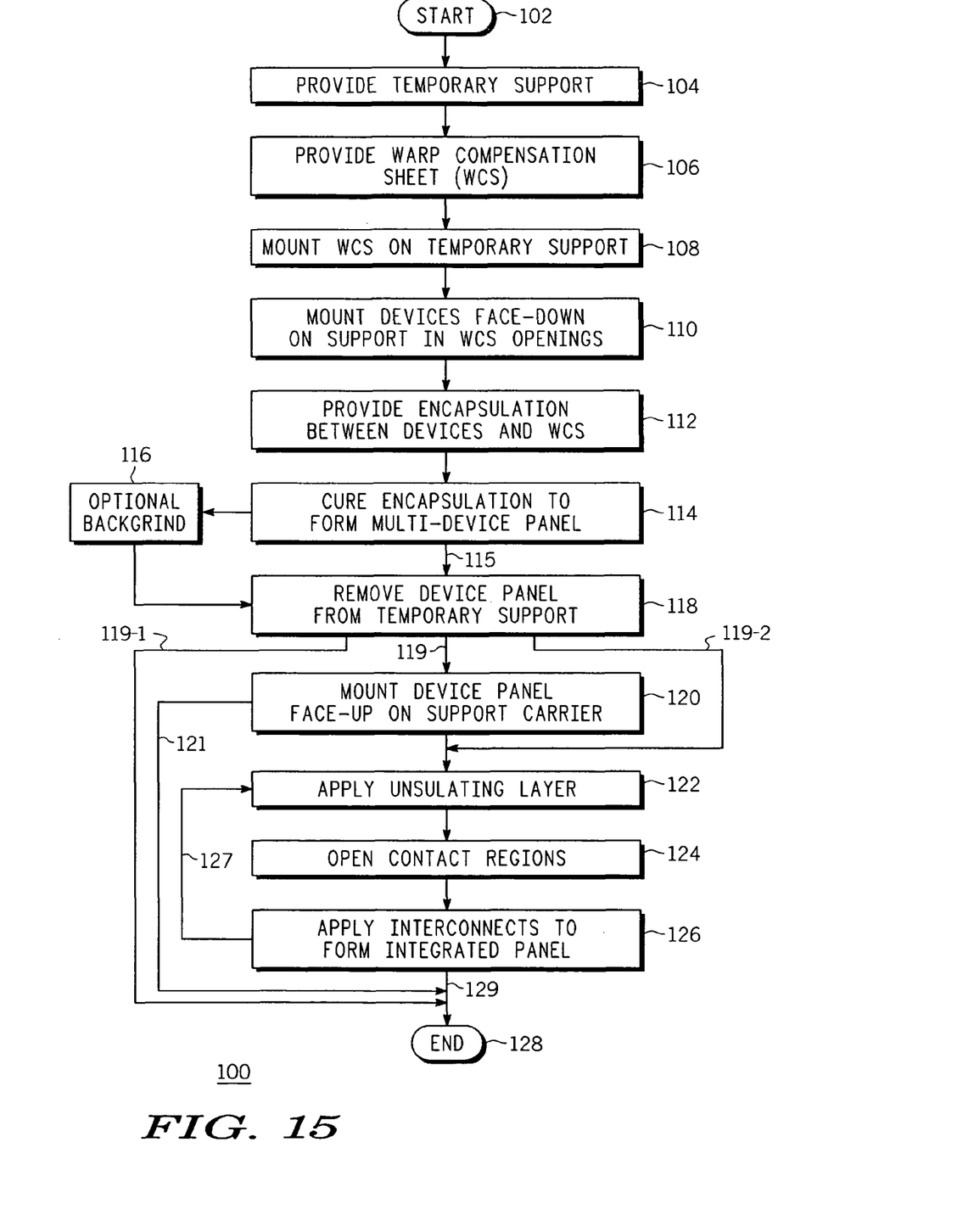
FIG. 15 illustrates a method of plastic encapsulation of electronic devices corresponding to the manufacturing stages of FIGS. 6-14 and according to a yet further embodiment of the present invention and showing further details.

FIG. 15 illustrates method 100 of plastic encapsulation of electronic devices, employing warp compensation sheet (WCS) 40, relating to the manufacturing stages of FIGS. 6-14 and according to a yet further embodiment of the present invention showing further details. Method 100 begins at START 102 and initial PROVIDE TEMPORARY SUPPORT step 104 wherein temporary support 60 is provided including adhesive layer 62. In PROVIDE WARP COMPENSATION SHEET (WCS) step 106, WCS 40 of FIG. 9 is fabricated or obtained as described herein, in particular, having the appropriate CTE for the encapsulation being provided in subsequent step 112, so that the resulting panels have no concave warp and are either flat or have convex warp of an amount within the pull-down range of the tools intended to be used for subsequent processing to form an integrated multi-device panel. Openings 44 in WCS 40 are sized for the die or other chips or devices 30 that are intended to be mounted therein, and where various types of die of different sizes are to be included in the same panel, different openings may have different sizes to accommodate die of different sizes. In FIGS. 1-14 openings 44 and devices 30 are assumed to be of uniform size and shape, but this is merely for convenience of explanation and not intended to be limiting. Steps 104, 106 may be performed in either order. In step 108 corresponding to stage 90 of FIG. 6, WCS 40 is mounted on adhesive layer 62 or otherwise removably attached to temporary support 60. In step 110 corresponding to manufacturing stage 91 of FIG. 7, devices 30 are mounted face-down on adhesive 62 or otherwise removably attached to temporary support 60 in openings 44 of WCS 40. Stage 91-1 of FIG. 13 also shows the results of these two steps. Width 45 (see FIGS. 1 and 13) of openings 44 in WCS 40 are larger than widths 35 of devices 30 by approximately twice width 48 of gap 47. Fiduciary marks 49, 69 on WCS 40 may be used to accurately position devices 30 in openings 44 so that their location relative to WCS 40 and to each other is well determined. While only two fiduciary marks 49, 69 are shown on WCS 40 in FIGS. 1 and 13, persons of skill in the art will understand that these are merely exemplary and not intended to be limiting and that any number of fiduciary marks may be provided as a part of WCS 40 adjacent each opening 44 or elsewhere on WCS 40 and on one or both faces 42, 43 of WCS 40, as is desired by the designer. The present invention does not depend critically upon the exact nature of devices 30 and they can be, for example, integrated circuits, individual devices, filters, magnetostrictive devices, electro-optical devices, electro-acoustic devices, integrated passive devices such as resistors, capacitors and inductors, or other types of elements and/or combinations thereof, and can be formed of any materials able to withstand the encapsulation process. Non-limiting examples are various organic and inorganic semiconductors, type IV, III-V and II-VI materials, glasses, ceramics, metals, semi-metals, intermetallics and so forth, according to various embodiments of the present invention.

In subsequent step 112, resin encapsulation 50 is applied to temporary support substrate 60, WCS 40 and devices 30 as described in connection with stage 92 of FIG. 8 and stage 92-1 of FIG. 14, filling at least interstices or gaps 47 between edges 32 of devices 30 and edges 46 of openings 44 in WCS 40. It is important that the coefficient of thermal expansion (CTE) of encapsulation 50 be chosen relative to the CTE of WCS 40 so that any resulting warp of EPA 82 after encapsulation step 112 is convex and preferably of magnitude less than at least about 5% of the diameter or lateral extend of EPA 82 and, more preferably, less than or equal about 1-2% thereof. In various embodiments, portion 52 (see FIGS. 8 and 14) of encapsulation 50 may overly rear faces 33 of devices 30 and rear face 43 of WCS 40 although that is not essential. In step 114 encapsulation 50 is desirably cured as has already been described. It as been found that heating in nitrogen or a substantially inert gas for 30-120 minutes at 50-170° C. is useful with 60-90 minutes at about 100-150° C. being preferred. Care should be taken not render adhesive layer 62 insoluble. Thus a two-stage cure may be desirable depending upon the choice of adhesive layer 62, with the second stage after step 118, but this is not essential. In further embodiments, optional backgrind step 116 may then be performed as has already been described in connection with FIGS. 8-10 wherein, for example and not intended to be limiting, portion 52 of encapsulation 50 is removed by grinding, etching, a combination thereof or other convenient means, leaving WCS 40 with embedded devices 30, to form EPA 82. EPA 82 has thickness 58 between upper face 57 and lower faces 56 (see FIG. 10) desirably of about 200-1000 micrometers with about 550-750 micrometers being preferred, depending upon thickness 34 of devices 30 and thickness 41 WCS 40. If wet grinding is used during optional backgrind step 116, it is desirable to subject device panel 82 to a brief drying cycle to remove any moisture that may have been absorbed during backgrind. About 10-20 minutes at 80-120° C. is useful with about 15 minutes at about 100° C. being preferred. Alternatively in various embodiments, method 100 may proceed directly from step 114 to step 118 as shown by path 115, depending upon the needs of the designer of the device array being formed.

In an embodiment including step 118, device panel 57 is separated from temporary support substrate 60 as shown in connection with FIG. 10. Substrate 60 can be released from device panel 82 by soaking the combination of panel 82 and substrate 60 in solvents that soften adhesive layer 62. The choice of solvent will depend on the choice of adhesive layer 62. In a preferred embodiment where adhesive layer 62 comprises double sided polyimide tape with silicone adhesive surfaces, acetone is a suitable solvent. The resulting structure is shown in FIG. 10. Device panel 82 is useful as-is and in such embodiment method 100 can, optionally proceed to END 128 as shown by path 119-1 or to integration steps 122-126 as shown by path 119-2, depending upon the needs of the panel designer and fabricator. Alternatively, method 100 can proceed in a still further embodiment to step 120 as shown by path 119 wherein EPA 82 is mounted by lower face 56 on support carrier 70, as shown and described in connection with FIG. 11. Adhesive 72 is preferably used to mount device panel 82 on support carrier 70, as has already been described in connection with FIG. 11, thereby forming reinforced composite electronic panel assembly 83 of FIG. 11. Reinforced EPA 83 is useful as-is and in such embodiment method 100 can optionally, proceed to END 128 after step 120 as indicated by path 121. However, in a further embodiment in order to provide an electrically integrated panel 84, 84' such as is illustrated in FIGS. 3 and 12, method 100 can proceed with subsequent steps 122, 124, 126 wherein some or all of bonding pads 36 on devices 30 are interconnected in the desired manner and coupled to appropriate input-output (I/O) terminals 88 (e.g., see FIGS. 3 and 12). For embodiments wherein such an integrated panel is desired, then in step 122 insulating layer 85 is applied over faces 31 of devices 30, surface 43 of WCS 40 and surface 54 of encapsulation 50 (collectively surface 57 of EPA 82), and in step 124 contact region vias are opened in insulating layer 85 to desired bonding pads 36, and in step 126 they are electrically coupled to each other or to external terminals or both by applying conductive interconnects 87. Persons of skill in the art will understand based on the teachings herein, that more than one insulating layer 85, more than one set of vias 86 and more than one conductor layer 87 may be required to achieve the desired interconnections of multiple devices 30 in EPA 82 to form IEPA 84, 84'. Accordingly, as indicated by path 127 corresponding to such further embodiments, steps 122, 124, 126 may be repeated as often as necessary in order to achieve the desired interconnections within EPA 82 and to external terminals 88. When the desired interconnectivity has been achieved, then according to such embodiments, method 100 proceeds to end 128 as shown by path 129 and IEPA 84, 84' such as are illustrated in FIGS. 3 and 12 are obtained.

According to a first exemplary embodiment there is provided a method for forming an electrical assembly, comprising, providing multiple electronic devices with primary faces where electrical contacts are located, opposed rear faces, and edges extending between the primary and rear faces, providing a perforated warp control sheet having multiple openings therein sized to accept the multiple electronic devices and having a first coefficient of thermal expansion (CTE), providing a temporary support adapted to receive the multiple electronic devices and the perforated warp control sheet on a principal surface thereof, then in either order, placing the perforated warp control sheet and the multiple electronic devices on the principal surface of the temporary substrate, with the multiple electronic devices in the openings in the perforated warp control sheet so that gaps are located between the edges of the electronic devices and edges of the openings in the perforated warp control sheet, and wherein the primary faces of the electronic devices are oriented toward the principal surface of the temporary support, providing plastic encapsulation at least in the gaps, wherein a second CTE of the encapsulation material is equal or greater than the first CTE, and separating the devices, the perforated warp control sheet and the plastic encapsulation in the gaps from the temporary support, thereby providing a panel containing the multiple electronic devices and the perforated warp control sheet joined by the plastic encapsulation. According to a further exemplary embodiment, the method further comprises after the separating step, applying one or more insulating layers at least over the primary electrical faces of the devices in the panel, providing vias through some of the one or more insulating layers to various electrical contacts of the devices, and forming conductors over one or more of the insulating layers and through one or more of the vias to interconnect various electrical contacts together or to external terminals or both, thereby providing an integrated electrical assembly. According to a still further exemplary embodiment, the steps of providing a perforated warp control sheet and providing a plastic encapsulation comprise, providing a warp control sheet and a plastic encapsulation having relative first and second coefficients of thermal expansion such that after encapsulation and separation any warp of the panel is convex. According to a yet further exemplary embodiment, the warp is convex and less than about 5% of the lateral extent of the panel. According to a still yet further exemplary embodiment, the warp is less than about 2%. According to a yet still further exemplary embodiment, the first CTE in the range of 50-95% of the second CTE. According to another exemplary embodiment, the first CTE in the range of 55-85% of the second CTE. According to a still another exemplary embodiment, the step of providing plastic encapsulation at least in the gaps, comprises, providing the plastic encapsulation in the gaps and over rear faces of the multiple electronic devices and the perforated warp control sheet, and then backgrinding the plastic encapsulation to expose the rear faces of the multiple electronic devices. According to a yet another exemplary embodiment, the first CTE is in the range of about 6.5-12.4 ppm/° C. According to a still yet another exemplary embodiment, the first CTE is in the range of about 7.2-11.1 ppm/° C.

According to a second exemplary embodiment, there is provided a method for forming an integrated electronic panel assembly (IEPA) having multiple electronic devices, comprising, providing multiple electronic devices with first faces having bonding pads thereon, opposed rear faces, and edges extending between the first faces and rear faces, providing a temporary support having a principal face, providing a warp control plane having openings therein adapted to receive the multiple electronic devices, wherein the warp control plane has a first coefficient of thermal expansion (CTE) less than a second CTE, mounting the warp control plane and the multiple electronic devices on the temporary support with the multiple electronic devices located in the openings in the warp control plane with their bonding pads oriented toward the principal face, and wherein a gap separates the edges of each of the multiple electronic devices from each opening in the warp control plane, providing plastic encapsulation having the second CTE at least between edges of the multiple electronic devices and the openings in the warp control plane on the temporary support, curing the plastic encapsulation at least sufficiently to substantially fix the multiple electronic devices and the warp control plane in the encapsulation, thereby forming a panel of multiple electronic devices on the temporary support, separating the panel from the temporary support so that the bonding pads are exposed, and connecting some of the bonding pads on the panel to each other or to external terminals or both. According to a further exemplary embodiment, the method further comprises after the separating step and before the interconnecting step, mounting the panel on a carrier with the rear faces of the multiple electronic devices facing the carrier and the bonding pads exposed. According to a still further exemplary embodiment, the interconnecting step comprises, applying one or more insulating layers over the multiple electronic devices, opening vias to at least some of the bonding pads, and providing conductive interconnects extending through some of the vias in the one or more insulating layers to electrically couple some of the bonding pads to each other or to external connections to the panel or both. According to a yet further exemplary embodiment, the warp control plane comprises a nickel-iron alloy with between about 40-52% nickel. According to a still yet further exemplary embodiment, the first CTE is in the range of about 50-95% of the second CTE. According to a yet still further exemplary embodiment, the first CTE is in the range of about 55-85% of the second CTE.

According to a third exemplary embodiment, there is provided an integrated electronic assembly, comprising, multiple electronic devices having front faces with bonding pads thereon, opposed rear faces and edges extending therebetween, a substantially planar sheet having openings therein in which the multiple electronic devices are located and wherein the substantially planar sheet has a first coefficient of thermal expansion (CTE), plastic encapsulation in at least the openings in the substantially planar sheet coupling the electronic devices to the substantially planar sheet so that an initial electronic assembly is formed with the bonding pads exposed, wherein the plastic encapsulation has a second CTE relative to the first CTE such that the initial electronic assembly is substantially flat or has a convex warp, and interconnections extending to some of the multiple electronic devices of the initial electronic assembly thereby coupling some of the bonding pads to each other or to external terminals or both to form the integrated electronic assembly. According to a further exemplary embodiment, the convex warp is less than about 5% of the lateral extent of the initial electronic assembly. According to a still further exemplary embodiment, the convex warp is less than or equal about 2%. According to a yet further exemplary embodiment, the substantially planar sheet comprises nickel and iron.

While at least one exemplary embodiment has been presented in the foregoing detailed description, it should be appreciated that a vast number of variations exist. For example, and not intended to be limiting, devices 30 and encapsulation 50 may be of any type and technology and not limited merely to the examples given. Similarly, while various preferred materials and packaging methods for the die panel are described herein, persons of skill in the art will understand that a large number of alternatives exist according to different embodiments of the present invention, for example and not intended to be limiting, for various support substrates and carriers and WCS's and adhesives and other layers used herein, and such are intended to be included in the scope of the claims that follow. Further, the exemplary implementations and embodiments presented herein yield die panels in various stages of completion that are useful in intermediate as well as finished form and such are intended to be included within the scope of the claims that follow.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming an electrical assembly, comprising:
    providing multiple electronic devices with primary faces where electrical contacts are located, opposed rear faces, and edges extending between the primary and rear faces;
    providing a perforated warp control sheet having multiple openings therein sized to accept the multiple electronic devices and having a first coefficient of thermal expansion (CTE);
    providing a temporary support adapted to receive the multiple electronic devices and the perforated warp control sheet on a principal surface thereof;
    then in either order, placing the perforated warp control sheet and the multiple electronic devices on the principal surface of the temporary support, with the multiple electronic devices in the openings in the perforated warp control sheet so that gaps are located between the edges of the electronic devices and edges of the openings in the perforated warp control sheet, and wherein the primary faces of the electronic devices are oriented toward the principal surface of the temporary support;
    providing plastic encapsulation material at least in the gaps, wherein a characteristic of the plastic encapsulation material is that a second CTE of the plastic encapsulation material is equal or greater than the first CTE;
    curing the plastic encapsulation material, wherein the characteristic that the second CTE is equal to or greater than the first CTE results, after curing, in a panel containing the multiple electronic devices and the perforated warp control sheet having a convex warp wherein a first surface of the panel at which the primary faces are exposed has a convex curve; and
    separating the devices, the perforated warp control sheet and the plastic encapsulation in the gaps from the temporary support, thereby providing the panel containing the multiple electronic devices and the perforated warp control sheet joined by the plastic encapsulation.

2. The method of claim 1, further comprising after the separating step:
    applying one or more insulating layers at least over the primary electrical faces of the devices in the panel;
    providing vias through some of the one or more insulating layers to various electrical contacts of the devices; and
    forming conductors over one or more of the insulating layers and through one or more of the vias to interconnect various electrical contacts together or to external terminals or both, thereby providing an integrated electrical assembly.

3. The method of claim 1, wherein the steps of providing a perforated warp control sheet and providing a plastic encapsulation comprise, providing a perforated warp control sheet and a plastic encapsulation having relative first and second coefficients of thermal expansion such that after encapsulation and separation any warp of the panel is convex.

4. The method of claim 1, wherein the convex warp is less than about 5% of the lateral extent of the panel.

5. The method of claim 4, wherein the convex warp is less than about 2% of the lateral extent of the panel.

6. The method of claim 1, wherein the first CTE in the range of 50-95% of the second CTE.

7. The method of claim 6, wherein the first CTE in the range of 55-85% of the second CTE.

8. The method of claim 1, wherein the step of providing plastic encapsulation at least in the gaps, comprises, providing the plastic encapsulation in the gaps and over rear faces of the multiple electronic devices and the perforated warp control sheet, and then backgrinding the plastic encapsulation to expose the rear faces of the multiple electronic devices.

9. The method of claim 1, wherein the first CTE is in the range of about 6.5-12.4 ppm/° C.

10. The method of claim 1, wherein the first CTE is in the range of about 7.2-11.1 ppm/° C.

11. The method of claim 1, further comprising:
    mounting the panel on an upper surface of an alignment chuck so that a second surface of the panel, which is opposed to the first surface of the panel and has a concave curve, is facing the upper surface of the alignment chuck;
    applying a vacuum to the alignment chuck to pull the panel flat against the upper surface of the alignment chuck;
    applying one or more insulating layers over the primary faces of the multiple electronic devices;
    opening vias to at least some of the electrical contacts; and
    providing conductive interconnects extending through some of the vias in the one or more insulating layers to electrically couple some of the electrical contacts to each other or to external connections to the panel or both.

12. A method for forming an integrated electronic panel assembly (IEPA) having multiple electronic devices, comprising:
providing multiple electronic devices with first faces having bonding pads thereon, opposed rear faces, and edges extending between the first faces and rear faces;
providing a temporary support having a principal face;
providing a warp control plane having openings therein adapted to receive the multiple electronic devices, wherein the warp control plane has a characteristic that a first coefficient of thermal expansion (CTE) of the warp control plane is less than a second CTE;
mounting the warp control plane and the multiple electronic devices on the temporary support with the multiple electronic devices located in the openings in the warp control plane with their bonding pads oriented toward the principal face, and wherein a gap separates the edges of each of the multiple electronic devices from each opening in the warp control plane;
providing plastic encapsulation having the second CTE at least between edges of the multiple electronic devices and the openings in the warp control plane on the temporary support;
curing the plastic encapsulation at least sufficiently to substantially fix the multiple electronic devices and the warp control plane in the encapsulation, thereby forming a panel of multiple electronic devices on the temporary support, wherein the characteristic that the first CTE is less than the second CTE results in the panel, after curing, having a convex warp wherein a first surface of the panel at which the first faces are exposed has a convex curve;
separating the panel from the temporary support so that the bonding pads are exposed; and
connecting some of the bonding pads on the panel to each other or to external terminals or both.

13. The method of claim 12, further comprising after the separating step and before the interconnecting step mounting the panel on a carrier with the rear faces of the multiple electronic devices facing the carrier and the bonding pads exposed.

14. The method of claim 13, wherein the interconnecting step comprises:
applying one or more insulating layers over the multiple electronic devices;
opening vias to at least some of the bonding pads; and
providing conductive interconnects extending through some of the vias in the one or more insulating layers to electrically couple some of the bonding pads to each other or to external connections to the panel or both.

15. The method of claim 12, wherein the warp control plane comprises a nickel-iron alloy with between about 40-52% nickel.

16. The method of claim 12, wherein the first CTE is in the range of about 50-95% of the second CTE.

17. The method of claim 12, wherein the first CTE is in the range of about 55-85% of the second CTE.

18. The method of claim 12, further comprising:
mounting the panel on an upper surface of an alignment chuck so that a second surface of the panel, which is opposed to the first surface of the panel and has a concave curve, is facing the upper surface of the alignment chuck;
applying a vacuum to the alignment chuck to pull the panel flat against the upper surface of the alignment chuck;
applying one or more insulating layers over the first faces of the multiple electronic devices;
opening vias to at least some of the bonding pads; and
providing conductive interconnects extending through some of the vias in the one or more insulating layers to electrically couple some of the bonding pads to each other or to external connections to the panel or both.

* * * * *